(12) United States Patent
Govia et al.

(10) Patent No.: US 12,353,845 B2
(45) Date of Patent: Jul. 8, 2025

(54) DUFFING OSCILLATOR RESERVOIR COMPUTER

(71) Applicant: RAYTHEON BBN TECHNOLOGIES CORP., Cambridge, MA (US)

(72) Inventors: Luke Colin Gene Govia, Somerville, MA (US); William Daniel Kalfus, River Vale, NJ (US); Guilhem Jean Ribeill, Bedford, MA (US); Graham Earle Rowlands, Arlington, MA (US); Hari Kiran Krovi, Lexington, MA (US); Thomas Akira Ohki, Arlington, MA (US)

(73) Assignee: RAYTHEON BBN TECHNOLOGIES CORP., Cambridge, MA (US)

( * ) Notice: Subject to any disclaimer, the term of this patent is extended or adjusted under 35 U.S.C. 154(b) by 1010 days.

(21) Appl. No.: 17/393,372

(22) Filed: Aug. 3, 2021

(65) Prior Publication Data

US 2022/0229632 A1    Jul. 21, 2022

Related U.S. Application Data

(60) Provisional application No. 63/139,482, filed on Jan. 20, 2021.

(51) Int. Cl.
| | | |
|---|---|---|
| G06F 7/38 | (2006.01) |
| G06F 7/50 | (2006.01) |
| G06F 7/523 | (2006.01) |
| G06F 7/544 | (2006.01) |
| H03B 15/00 | (2006.01) |

(52) U.S. Cl.
CPC ............. *G06F 7/388* (2013.01); *G06F 7/50* (2013.01); *G06F 7/523* (2013.01); *G06F 7/5443* (2013.01); *H03B 15/003* (2013.01)

(58) Field of Classification Search
CPC ........ G06F 7/388; G06N 3/044; G06N 3/065; G06N 7/043; G06N 10/40
See application file for complete search history.

(56) References Cited

PUBLICATIONS

D. Guillaume et al., Reservoir computing with a single delay-coupled non-linear mechanical oscillator, Research Article, Journal of Applied Physics, 2018 (Year: 2018).*

T.Y. Zheng et al., Parameters optimization method for the time-delayed reservoir computing with a nonlinear duffing mechanical oscillator, Scientific reports, Jan. 13, 2021 (Year: 2021).*

J.M. Zhou et al., Impact load identification of nonlinear structures using deep Recurrent Neural Network, Mechanical Systems and Signal Processing 133, 2019 (Year: 2019).*

(Continued)

*Primary Examiner* — Emily E Larocque
(74) *Attorney, Agent, or Firm* — CANTOR COLBURN LLP

(57) ABSTRACT

A reservoir computer. In some embodiments, the reservoir computer includes a Duffing oscillator, and a readout circuit, and the readout circuit is configured to calculate a plurality of products, each of the products being calculated by multiplying a sample, of a plurality of samples of a signal from the Duffing oscillator, by a respective weight of a plurality of weights.

14 Claims, 12 Drawing Sheets

(56) References Cited

PUBLICATIONS

A.R. Bulsara, Subthreshold response of rf SQUIDs to a general external perturbation, Naval Ocean Systems Center, 1982 (Year: 1982).*

MdM Hershenson et al., Design and optimization of LC oscillators, IEEE 1999 (Year: 1999).*

Coulombe, J. C. et al., "Computing with networks of nonlinear mechanical oscillators", PLoS ONE, Jun. 2, 2017, pp. 1-13, https://doi.org/10.1371/journal.pone.0178663.

Govia, L. C. G et al., "Quantum reservoir computing with a single nonlinear oscillator", Physical Review Research, Jan. 25, 2021, vol. 3, pp. 013077-1 through 013077-9, American Physical Society.

Kalfus, W. D. et al., "Neuromorphic computing with a single qudit", Jan. 27, 2021, pp. 1-12, arXiv:2101.11729v1.

Mesaritakis, C. et al, "Micro ring resonators as building blocks for an all-optical high-speed reservoir-computing bit-pattern-recognition system", Journal of the Optical Society of America B, Oct. 31, 2013, pp. 3048-3055, vol. 30, No. 11, Optical Society of America.

Torrejon, J. et al., "Neuromorphic computing with nanoscale spintronic oscillators", Nature, Jul. 27, 2017, pp. 428-432, vol. 547, Macmillan Publishers Limited.

\* cited by examiner

DUFFING OSCILLATOR RESERVOIR COMPUTER

CROSS-REFERENCE TO RELATED APPLICATION(S)

The present application claims priority to and the benefit of U.S. Provisional Application No. 63/139,482, filed Jan. 20, 2021, entitled "RESERVOIR COMPUTING APPROACH TO SIGNAL ANALYSIS WITH A DUFFING OSCILLATOR", the entire content of which is incorporated herein by reference.

GOVERNMENT LICENSE RIGHTS

This invention was made with Government support. The Government has certain rights in the invention.

FIELD

One or more aspects of embodiments according to the present disclosure relate to reservoir computers, and more particularly to a Duffing oscillator reservoir computer.

BACKGROUND

In various commercial applications, including, e.g., cellular networks and WiFi systems, various signal processing operations such as phase, amplitude, and frequency estimation may be performed. In some embodiments such operations may be performed by a digital signal processing circuit (e.g., a digital signal processor (DSP)); such a circuit may however consume a significant amount of power and occupy a significant amount of chip area.

Thus, there is a need for an improved method for signal processing.

SUMMARY

According to an embodiment of the present disclosure, there is provided a system, including: a Duffing oscillator, and a readout circuit, the readout circuit being configured to calculate a plurality of products, each of the products being calculated by multiplying a sample, of a plurality of samples of a signal from the Duffing oscillator, by a respective weight of a plurality of weights.

In some embodiments, the readout circuit is further configured to calculate the sum of the products.

In some embodiments, the plurality of samples includes ten samples.

In some embodiments, the system further includes an input circuit configured to receive an input signal, and to adjust the amplitude of the input signal, to an adjusted amplitude, to form an adjusted input signal.

In some embodiments, a reflection coefficient of the Duffing oscillator is hysteretic as a function of frequency when measured with a signal having an amplitude equal to the adjusted amplitude.

In some embodiments, the Duffing oscillator includes a resonant circuit including a varactor.

In some embodiments, the Duffing oscillator includes a resonant circuit including a superconducting quantum interference device (SQUID).

In some embodiments, the system is configured to estimate the phase of a sinusoidal input signal.

In some embodiments, the system is configured to estimate the frequency of a sinusoidal input signal.

In some embodiments, the system is configured to estimate the amplitude of a sinusoidal input signal.

In some embodiments, the system is configured to estimate the phase of each of two sinusoidal signals present in an input signal.

According to an embodiment of the present disclosure, there is provided a method, including: operating a reservoir computer, wherein: the reservoir computer includes: a Duffing oscillator and a readout circuit.

In some embodiments, the method further includes training the reservoir computer.

In some embodiments, the system further includes the operating of the reservoir computer includes calculating a plurality of products, each of the products being calculated by multiplying a sample, of a plurality of samples of a signal from the Duffing oscillator, by a respective weight of a plurality of weights.

In some embodiments, the system further includes the operating of the reservoir computer further includes calculating the sum of the products.

In some embodiments, the system further includes receiving an input signal, and adjusting the amplitude of the input signal, to an adjusted amplitude, to form an adjusted input signal.

In some embodiments, a reflection coefficient of the Duffing oscillator is hysteretic as a function of frequency when measured with a signal having an amplitude equal to the adjusted amplitude.

In some embodiments, the Duffing oscillator is in a state having an expected value of energy less than 10 hf wherein f is the small-amplitude resonant frequency of the Duffing oscillator and h is Planck's constant.

In some embodiments, the Duffing oscillator includes a resonant circuit including a varactor.

In some embodiments, the Duffing oscillator includes a resonant circuit including a superconducting quantum interference device (SQUID).

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a Duffing oscillator reservoir computer provided in accordance with the present disclosure and is not intended to represent the only forms in which some embodiments may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Reservoir computing is a general framework that may use a complex nonlinear system, the "reservoir" as a computational resource. In some embodiments, the internal dynamics and connectivity of the reservoir are not observed or manipulated, but a subset of nodes that are visible to external interactions form the input and output nodes. The reservoir may be a physical dynamical system the evolution of which is described by classical or quantum mechanics. For a classical reservoir, the nodes of the reservoir may be the classical dynamical degrees of freedom of the system. For a quantum reservoir, the nodes may be the free variables in the density matrix describing the quantum state of the reservoir. More precisely, the state of each node may be specified by the expectation value of an element of a complete basis for the operator space on the system's Hilbert space.

Reservoir computing may be inherently time-dependent, and the raw output vector $\vec{s} \in \mathbb{R}^{NT}$ may be a time-series sampling of the output of the N output nodes at T time points in response to an input signal u(t). The desired output vector $\vec{y} \in \mathbb{R}^{L}$ is given by $\vec{y} = W\vec{s}$, where $W \in \mathbb{R}^{L \times NT}$ is the output weight matrix for a task with L output classes. Training the reservoir consists of determining W, which can be computed as $$W = YS^T(SS^T + \gamma \mathbb{I})^{-1}, \quad (1)$$

where $S \in \mathbb{R}^{NT \times M}$ contains the sample vectors for M training instances, $Y \in \mathbb{R}^{L \times M}$ contains the known label values, and γ is a ridge-regression parameter used to prevent overfitting. As, such, unlike certain types of neural networks, for example, training the reservoir computer may not involve backpropagation; instead the training of the reservoir computer may be accomplished by performing a matrix inversion of the reservoir output.

Figure 1:
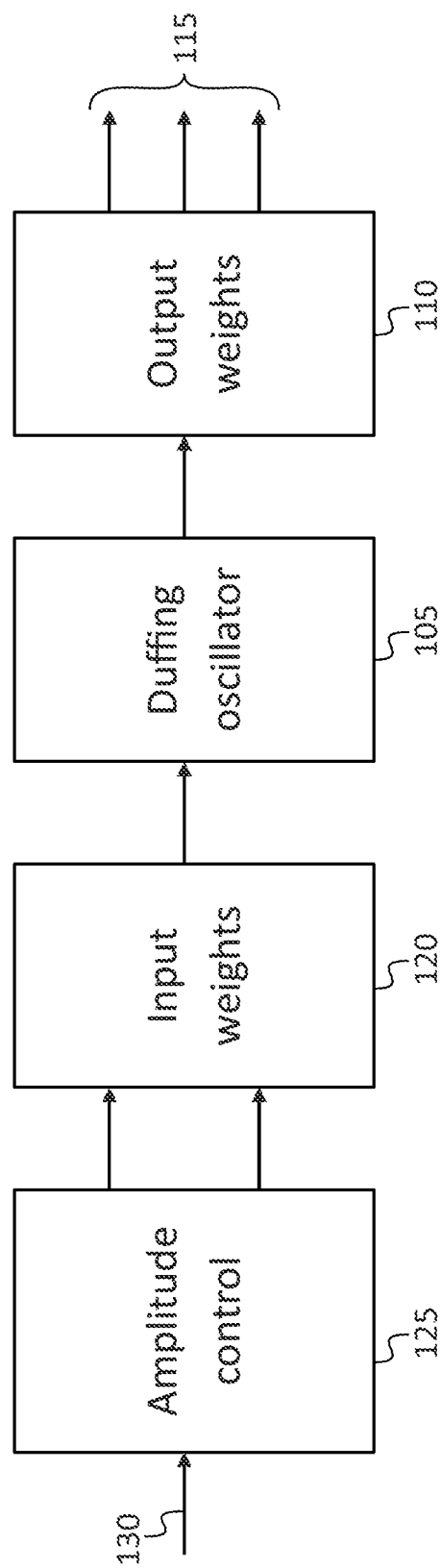
FIG. 1 is a block diagram of a reservoir computer, according to an embodiment of the present disclosure.

FIG. 1 shows a reservoir computer based on a Duffing oscillator 105, in some embodiments. In addition to the Duffing oscillator 105, the reservoir computer may include an amplitude control circuit 125, an input weighting circuit 120, and a readout circuit 110. As a classical reservoir, a Duffing oscillator may have an equation of motion $$\dot{a} = -i(\Omega + K)a - i2Ka^2 a^* - \frac{\kappa a}{2} - iu(T), \quad (2)$$

where $a = (X + iP)/\sqrt{2}$, Ω is the zero-excitation resonance frequency, K is the nonlinearity, and κ is the rate of excitation decay or oscillator line-width. X and P are the so-called quadratures that constitute the free variables of the system, and that may form the computational nodes. As such, for a Duffing oscillator 105, N may be less than or equal to 2. Duffing oscillators may be present in a variety of physical systems, such as electrical circuits (normal and superconducting), mechanical oscillators, spintronics, and optics.

As mentioned above, the input of the Duffing oscillator 105 may be the function u(t), the one or more outputs may be the signal or signals at one or both of the computational nodes, and the outputs may be connected to an output circuit or "readout" circuit 110. For an electrical Duffing oscillator (e.g., a tank circuit with a nonlinear capacitance or inductance), the computational nodes may be the voltage and the current, although only one of the nodes may be sampled (as for example in the circuits of FIGS. 5A and 5B, in which only the voltage is sampled). In some embodiments, both nodes are sampled. The readout circuit 110 may (i) sample the one or more outputs of the Duffing oscillator 105 at the T time points, and (ii) calculate a plurality of products, each of the products being calculated by multiplying one of the samples by a respective one of the weights, and it may (iii) sum the products, or a subset of the products, to produce the signal at a respective one of the outputs 115 of the reservoir computer. The sampling rate may be at least equal to the small-amplitude resonant frequency of the Duffing oscillator 105, and it may be as much as 10 or 100 times the small-amplitude resonant frequency (where the small-amplitude resonant frequency is the resonant frequency of the simple harmonic oscillator that the Duffing oscillator approximates at small amplitudes (for which the effect of the third order term of the Duffing oscillator becomes small)). In some embodiments, the sampling rate is less than the small-amplitude resonant frequency, or greater than 100 times the small-amplitude resonant frequency. In some embodiments, the time interval during which samples are obtained is about three times the reciprocal of the small-amplitude resonant frequency (as, for example, in FIGS. 2A and 2B), and ten or more samples (e.g., 20 samples) are obtained and processed. In some embodiments, the time interval during which samples are obtained is greater than or less than three times the reciprocal of the small-amplitude resonant frequency. In some embodiments, the reservoir computer has more or fewer than the three outputs shown in FIG. 1; for example, the reservoir computer may have only one output. The readout circuit may include an analog to digital converter, for obtaining the samples of the output of the Duffing oscillator 105, and a processing circuit (discussed in further detail below), for forming products and sums.

In some embodiments, an input circuit, which may include an input weighting circuit 120 and an amplitude control circuit 125, may be connected between the input 130 of the reservoir computer and the Duffing oscillator 105. The input weighting circuit 120 may combine two or more signals (as in the case, discussed in further detail below, of bichromatic phase estimation). The amplitude control circuit 125 may adjust the amplitude of the signal (e.g., amplify or attenuate the signal) at the input 130 of the reservoir computer so that the Duffing oscillator 105 receives, at its input, a signal having an adjusted amplitude, such that the nonlinear term in the differential equation describing the dynamics of the Duffing oscillator 105 has a suitable magnitude relative to the linear terms. For example, the adjusted amplitude may be one at which a reflection coefficient of the Duffing oscillator is hysteretic as a function of frequency. In FIG. 1 the amplitude control circuit 125 precedes the input weighting circuit 120; in some embodiments, one or both of the amplitude control circuit 125 and the input weighting circuit 120 is absent, or the input weighting circuit 120 precedes the amplitude control circuit 125.

To analyze a Duffing oscillator as a quantum reservoir, it may be considered to be a quantum system in a d-dimensional Hilbert space (qudit), which has $d^2-1$ real free variables that form the computational nodes. The evolution of the system may be given by the Lindblad master equation $$\dot{\rho} = -i[\hat{H},\rho] + \kappa \mathcal{D}[\hat{a}]\rho, \qquad (3)$$

where $\mathcal{D}[x]\rho = x\rho x^\dagger - \{x^\dagger x, \rho\}/2$ is the usual dissipator, and with Hamiltonian (with $\hbar=1$)

$$H = \Omega \hat{a}^\dagger \hat{a} + K \hat{a}^\dagger \hat{a}^\dagger \hat{a} \hat{a} + u(t)(\hat{a}+\hat{a}^\dagger), \qquad (4)$$

where $\hat{a} = \sum_{n=1}^{d} \sqrt{n} |n-1\rangle\langle n|$ is the qudit lowering operator. In the limit $d \to \infty$, the system becomes a single Kerr nonlinear oscillator, which is the quantum analog of the classical Duffing oscillator. In practice, for large enough d the reservoir may effectively model this formally infinite-dimensional system. Kerr nonlinear oscillators operating in the quantum regime may be constructed in superconducting circuits, quantum optics, and mechanical oscillators.

Following standard input-output theory, it may be assumed that the system decays (at least partially) into an output port that makes possible continuously monitoring the observable $X \propto a+a^*$ in the classical case, or $X \propto a+\hat{a}^\dagger$ in the quantum case. This gives the continuous raw output signal $s(t) = X(t)$ in the classical case, and $s(t) = \text{Tr}[\rho(t)\hat{X}]$ in the quantum case, from which T sample points may be used to define the sample vector (i.e., N=1).

In some embodiments, a Duffing oscillator reservoir computer is used to perform sinusoidal parameter estimation. For such a task, an input signal may have the form $$u(t) = \alpha \sin(\omega t + \phi) + \beta \qquad (5)$$

and the output may be trained to (i) individually estimate the amplitude $\alpha$, phase $\phi$, or frequency $\omega$ with the other two parameters fixed, or (ii) simultaneously estimate the amplitude $\alpha$ and phase $\phi$ of the signal for fixed $\omega$ and $\beta$. $\Omega$ may be set equal to zero, and all frequencies may be measured in units of $\kappa$, which may be set equal to zero (such that the analysis occurs in the rotating frame of the oscillator).

In some embodiments, the raw output vector consists of T samples of the reservoir output over the full duration of each input signal. Training set sizes and intervals are determined separately for each task, as discussed in further detail below. After the total duration of each input signal, the reservoir may be reset to its ground state.

Figure 2A:
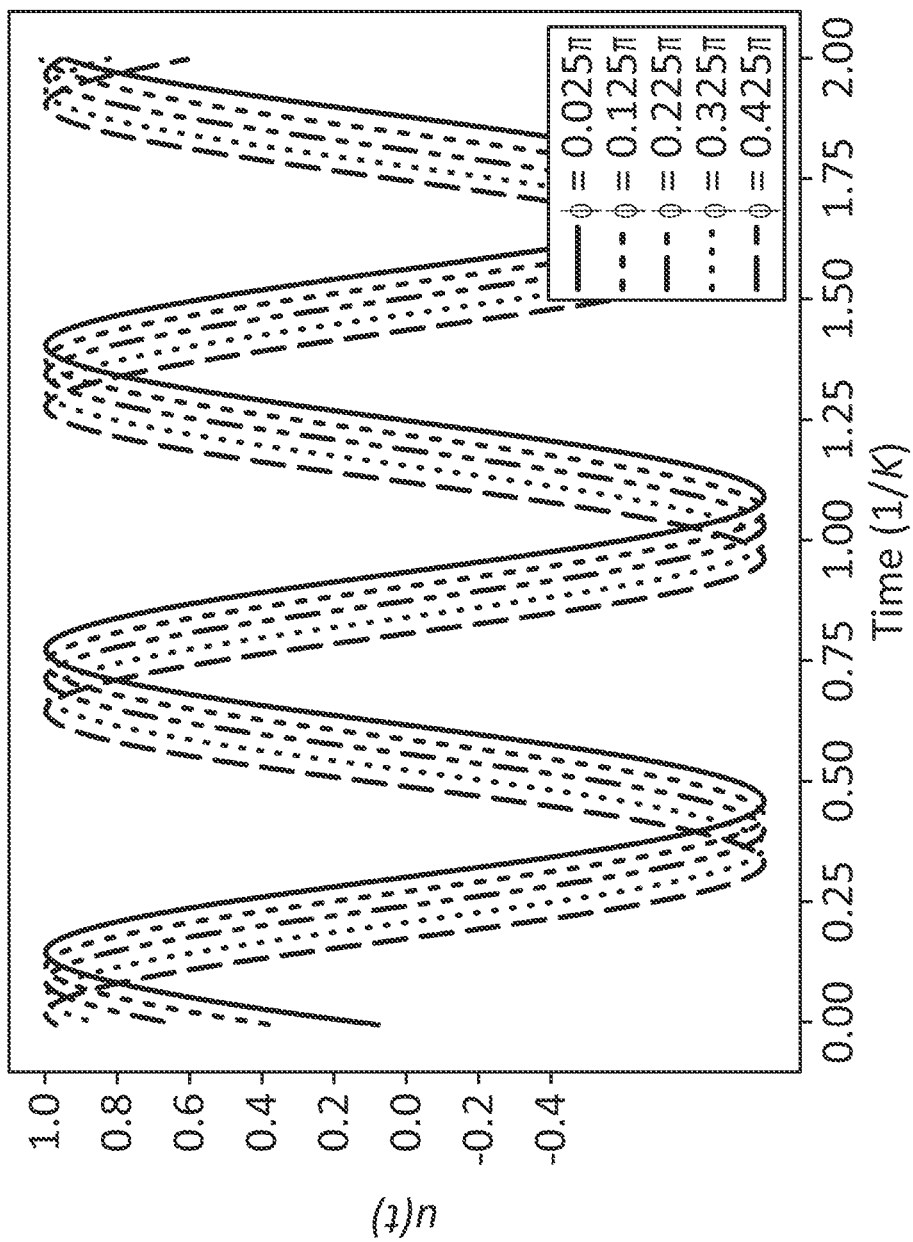
FIG. 2A is a graph of input signals, according to an embodiment of the present disclosure.
Figure 2B:
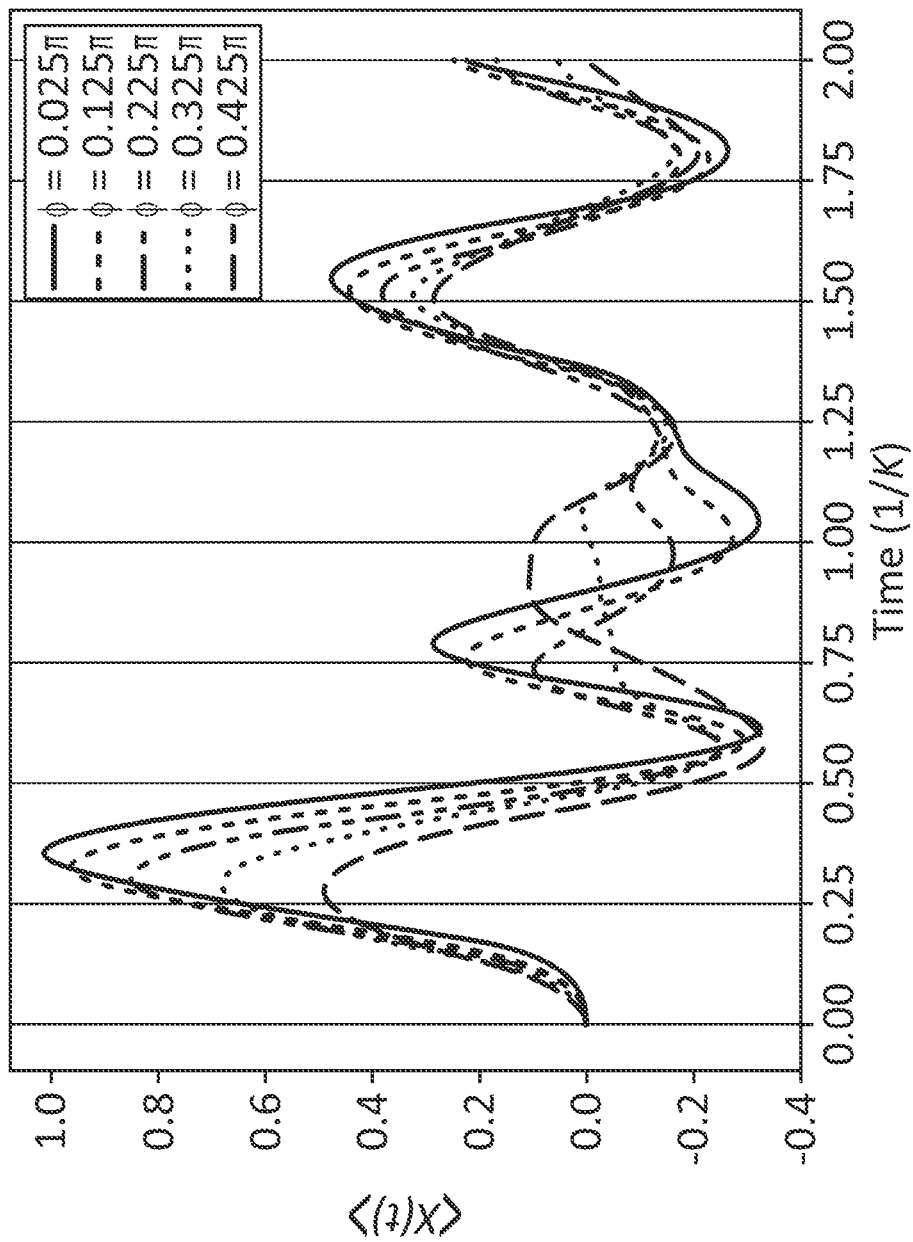
FIG. 2B is a graph of output signals, according to an embodiment of the present disclosure.
Figures 2C, 2D:
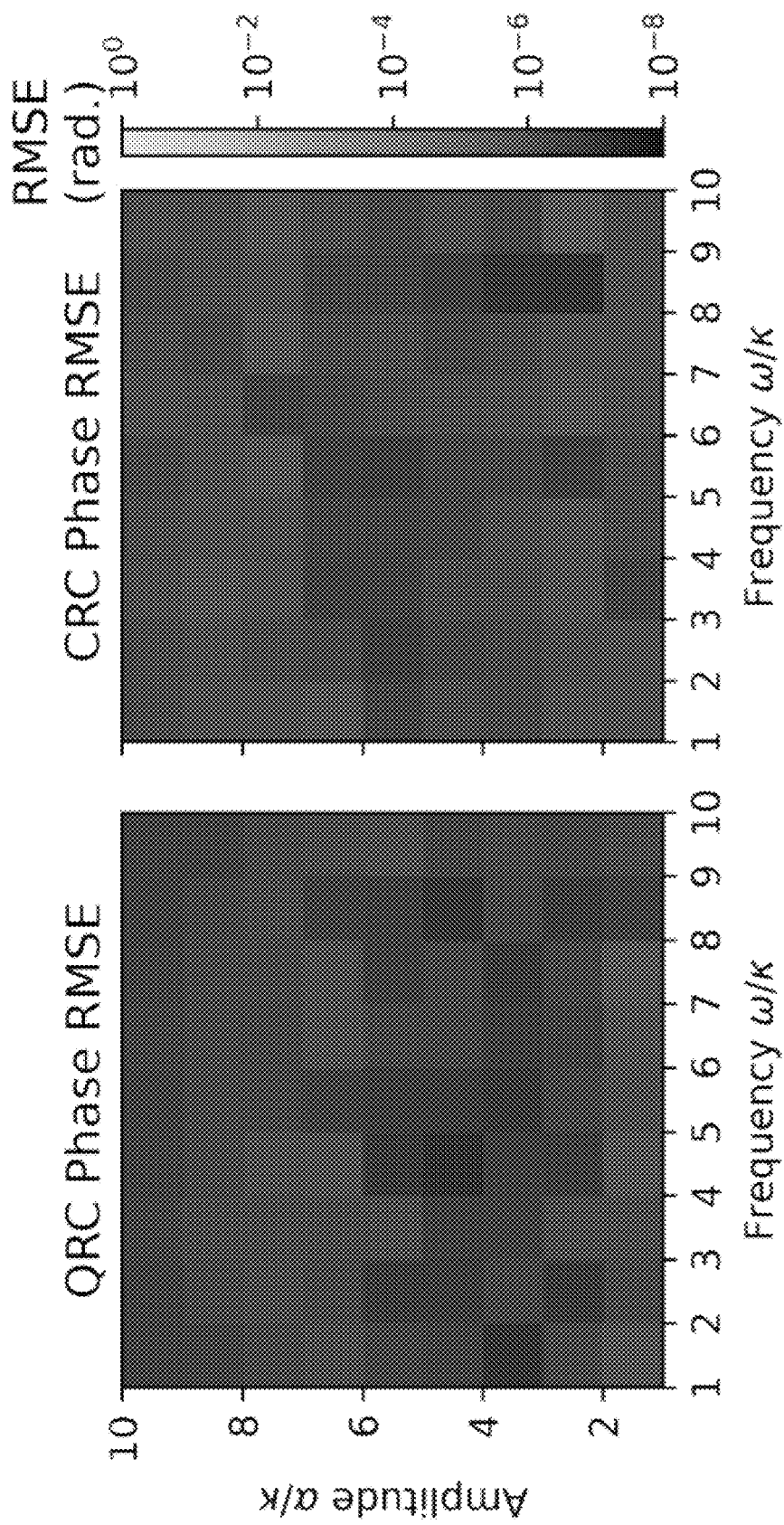
FIG. 2C is a graph of root mean squared error (RMSE), according to an embodiment of the present disclosure.
FIG. 2D is a graph of RMSE, according to an embodiment of the present disclosure.
Figures 2E, 2F:
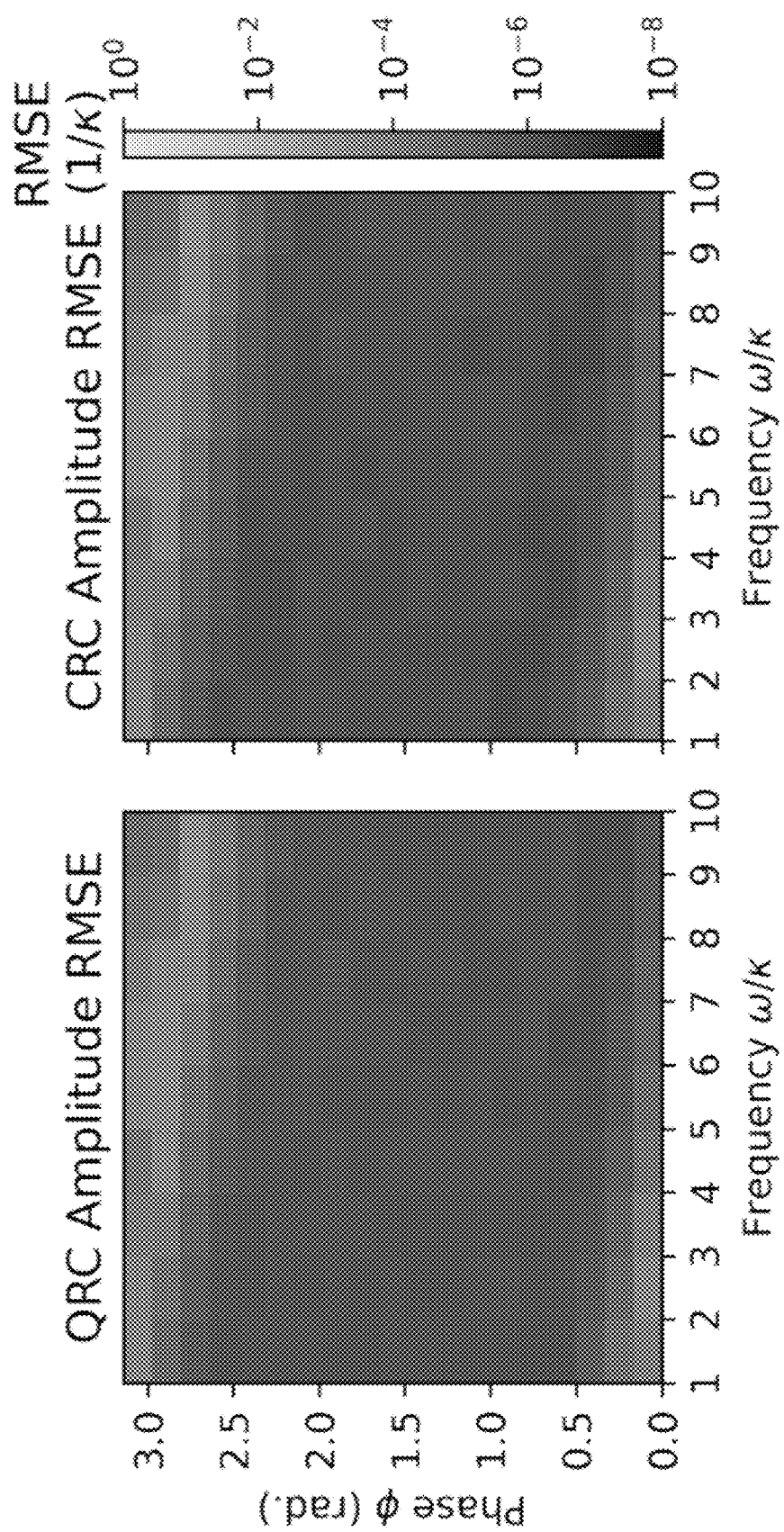
FIG. 2E is a graph of RMSE, according to an embodiment of the present disclosure.
FIG. 2F is a graph of RMSE, according to an embodiment of the present disclosure.

FIG. 2A shows a set of inputs with five different phases, and FIG. 2B shows the corresponding five output signals at the output of the Duffing oscillator 105. It may be seen that the separation between the five output signals is significantly greater than the separation between the input signals, so that appropriately weighted samples of the output of the Duffing oscillator 105 may have good sensitivity to the phase of the input signal. As such, the reservoir computer may be trained to perform phase estimation. The reservoir computer may similarly be trained to perform amplitude or frequency estimation.

As a metric for performance, the root-mean-squared error (RMSE) on the test set, given by $$RMSE = \sqrt{\frac{1}{J_{test}} \sum_{j=1}^{J_{test}} (x_j^{est} - x_j^{act})^2}, \qquad (6)$$

may be used, where $x_j^{est}$ and $x_j^{act}$ are the estimated and actual parameter, respectively, for the $j^{th}$ element of the test set.

Figures 2G, 2H:
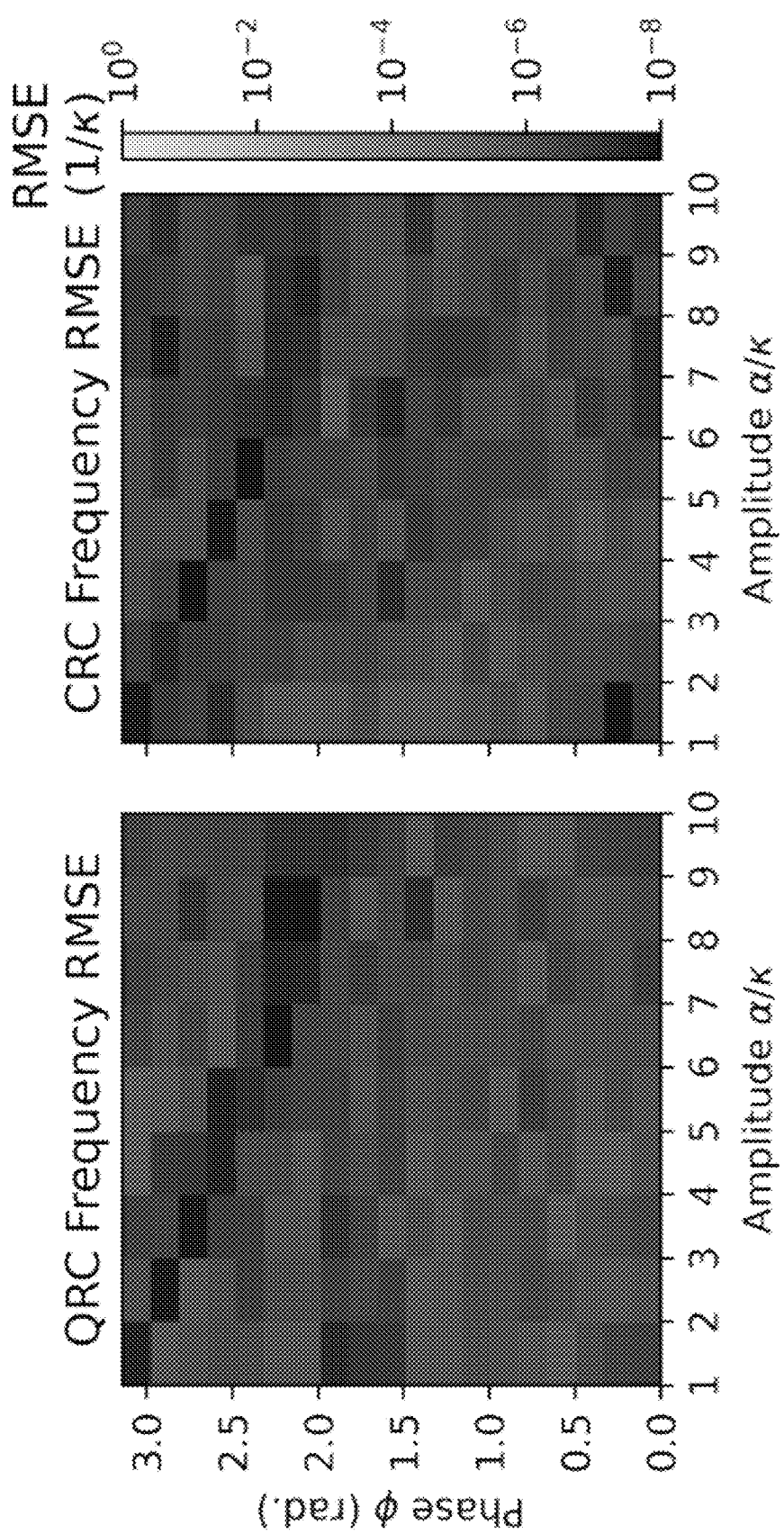
FIG. 2G is a graph of RMSE, according to an embodiment of the present disclosure.
FIG. 2H is a graph of RMSE, according to an embodiment of the present disclosure.

FIGS. 2C-2H show the simulated performance of (i) a quantum reservoir computer (FIGS. 2C, 2E, and 2G) and (ii) a classical reservoir computer (FIGS. 2D, 2F, and 2H), for the tasks of (i) phase estimation (FIGS. 2C and 2D), (ii) amplitude estimation (FIGS. 2E and 2F), and (iii) frequency estimation (FIGS. 2G and 2H). In each case the reservoir computer was first trained for the corresponding task. In particular, FIGS. 2C-2H show the best-case performance at signal parameter estimation for a d=15 quantum reservoir and a classical reservoir across 20 values of K randomly drawn from a uniform distribution over $[0.1\kappa, 10\kappa]$. Signal amplitude $\alpha$, frequency $\omega$, and phase $\phi$ are each learned separately while sweeping over the other two parameters with static bias $\beta=0$. Each parameter is trained with 10 uniformly-spaced training samples and tested with 100 random samples drawn from a uniform distribution over the training interval. The training interval for phase is $[0, \pi/2]$, for amplitude is $[\kappa, 10\kappa]$, and for frequency is $[\kappa, 10\kappa]$. When sweeping a given parameter, it is swept over its training interval, except for phase which is swept over 20 uniformly-spaces values on the interval $[0, \pi]$.

In some embodiments, when a reservoir computer has been trained for several tasks (resulting in several corresponding sets of weights), it may be configured to perform all of the tasks concurrently by feeding the samples of the output of the Duffing oscillator 105 to each of the sets of weights in parallel (or, equivalently, by multiplying the sample vector by a suitable matrix that includes, as elements, all of the weights of the sets of weights). In such an embodiment, the output of the reservoir computer may be a vector of values each being an estimate of a respective parameter (e.g., phase, amplitude, or frequency).

Figure 3:
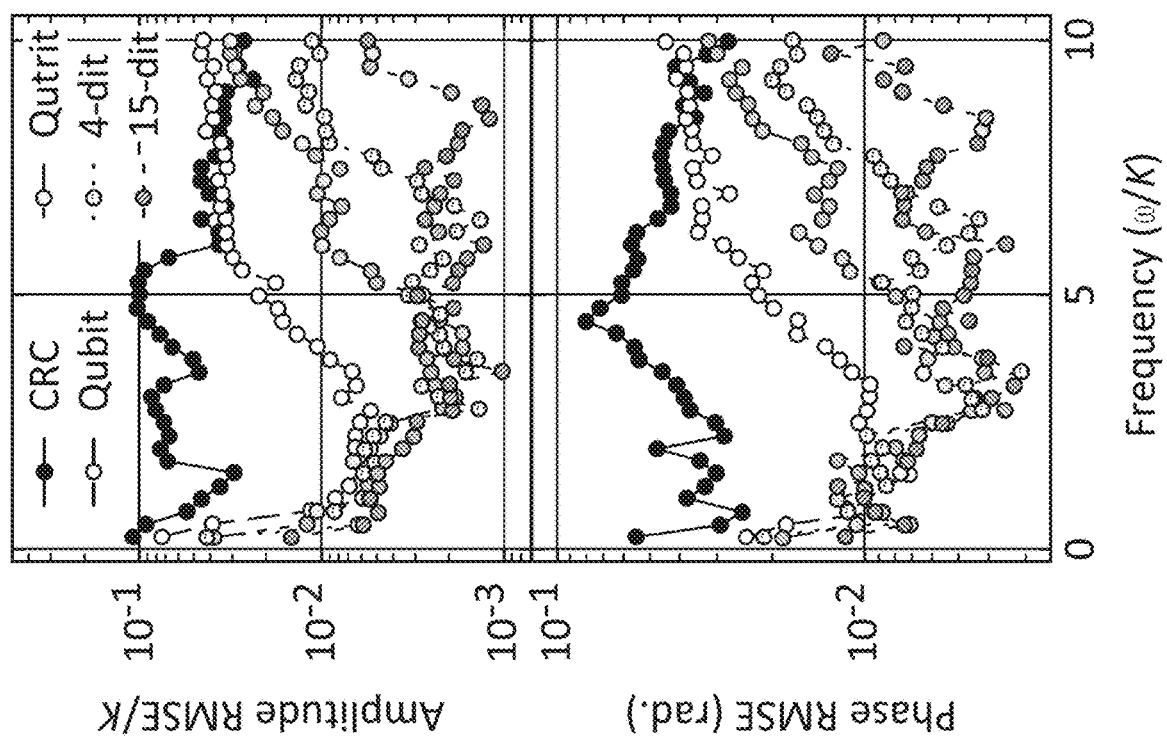
FIG. 3 is a graph of phase RMSE and amplitude RMSE, according to an embodiment of the present disclosure.

FIG. 3 shows the best-case simulated performance at simultaneous learning of amplitude and phase across 100 values of K randomly drawn from a uniform distribution over $[0.1\kappa, 10\kappa]$. Results are presented for a classical reservoir and for 2-, 3-, 4-, and 15-level quantum reservoirs. The training interval for phase is $[0, \pi/2]$ and for amplitude is $[\kappa, 10\kappa]$. Frequency is swept over $[\kappa, 10\kappa]$. Static bias is set to $\beta=10\kappa$. The training set consists of all pairs of amplitude and phase from sets of 100 each (yielding a total training set size of 10000). The test set consists of 3000 signals with random amplitude and phase drawn from uniform distributions over the respective training intervals.

Figure 4A:
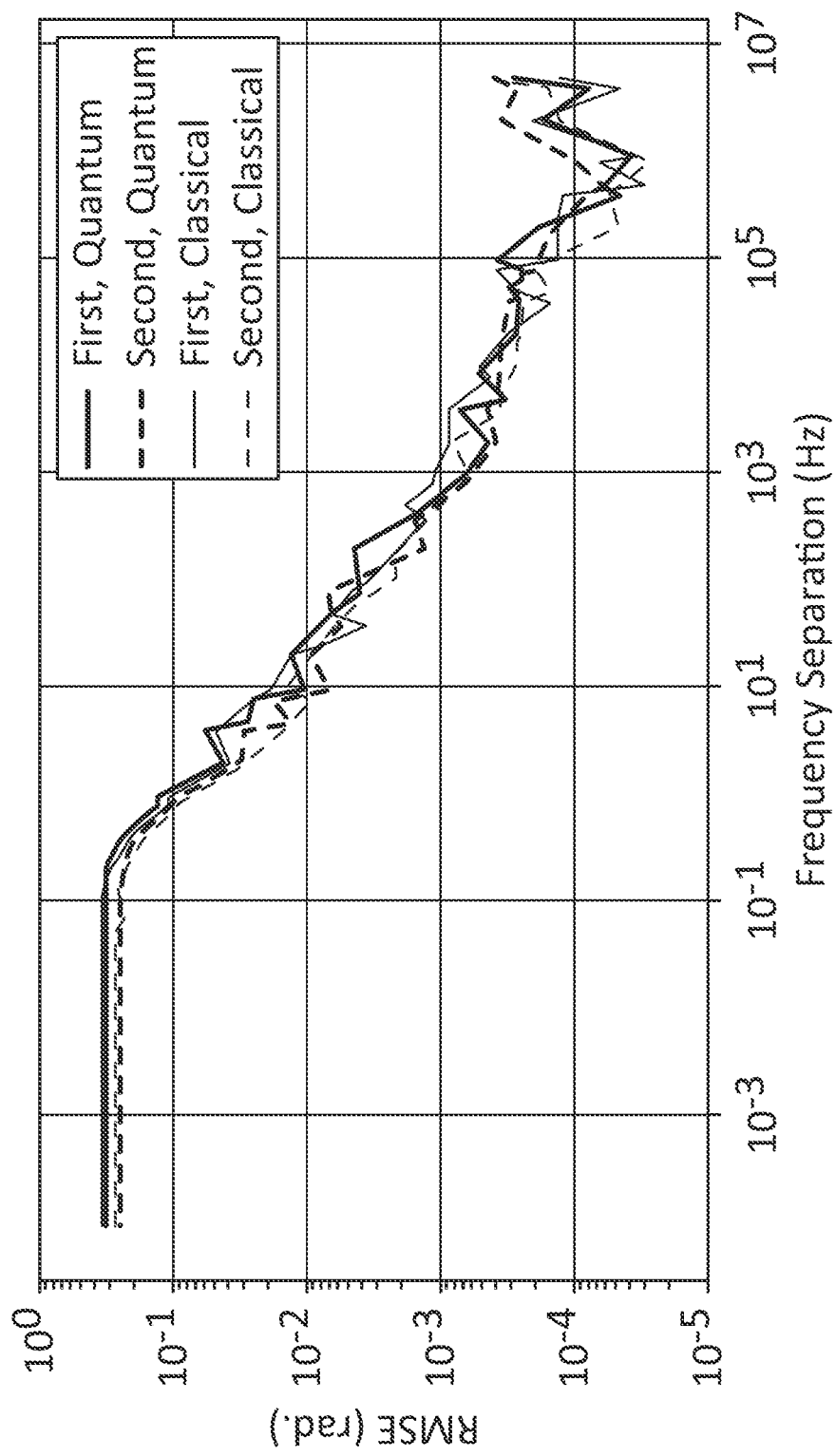
FIG. 4A is a graph of RMSE, according to an embodiment of the present disclosure.
Figure 4B:
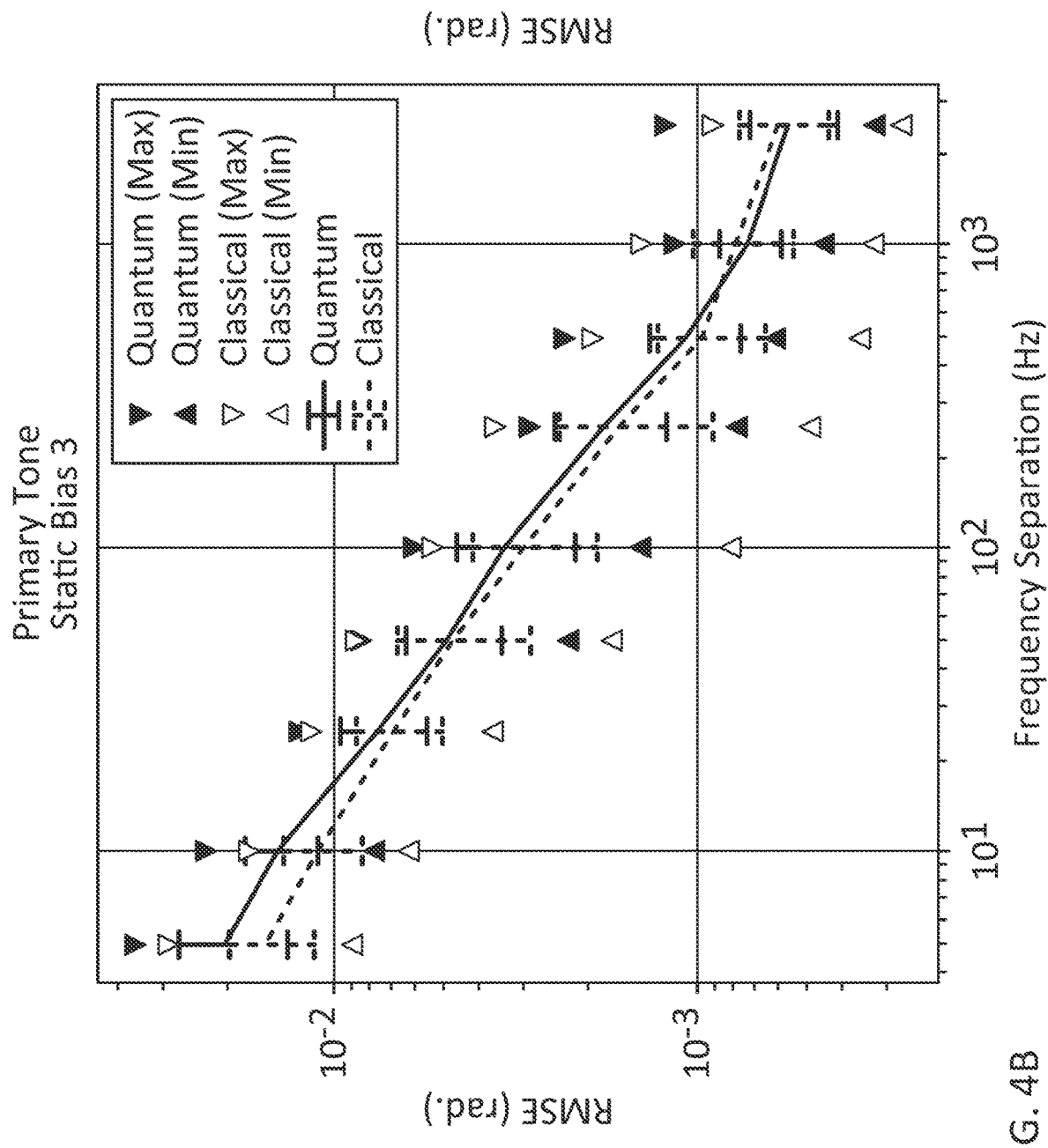
FIG. 4B is a graph of RMSE, according to an embodiment of the present disclosure.
Figure 4C:
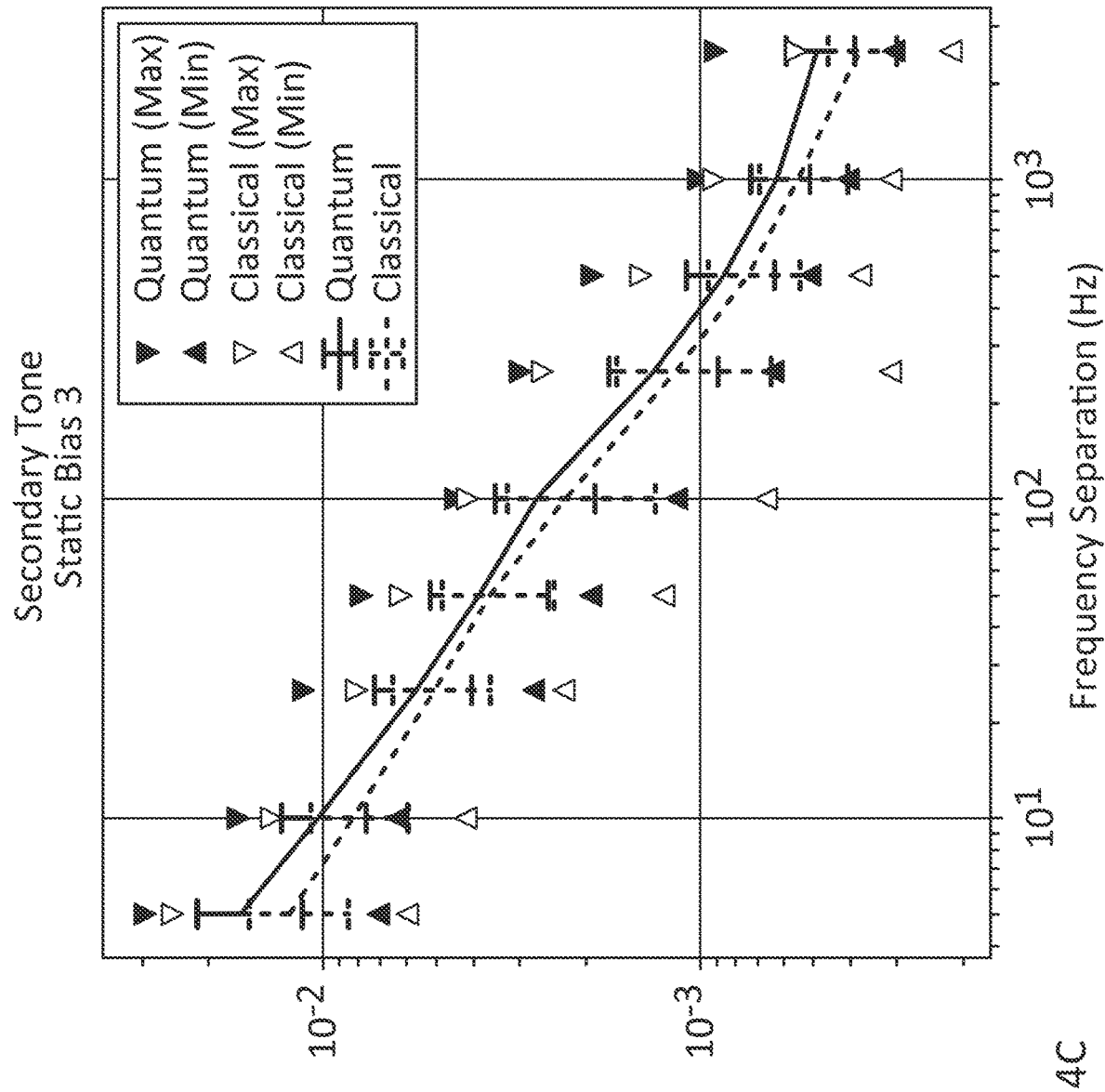
FIG. 4C is a graph of RMSE, according to an embodiment of the present disclosure.

FIGS. 4A-4C show simulated performance of an experimentally realistic device, for bichromatic phase estimation, i.e., phase estimation when the input of the Duffing oscillator 105 receives a first signal and a second signal, at two different respective frequencies, e.g., the input has the form $$u(t) = \alpha_1 \sin(\omega_1 t + \phi_j) + \alpha_2 \sin(\omega_2 t + \phi_j) + 3\kappa$$

Each of FIGS. 4A-4C shows the RMSE as a function of the frequency separation between the two frequency components. The units of frequency are Hz. In FIG. 4A, "First" and "Second" refer to the first and second signal. FIGS. 4B and 4C represent mean, std dev, min, and max performance of the reservoir computer over sets of reservoir parameters. Hence, min and max are the RMSE at the best and worst sets of parameters. In FIGS. 4B and 4C, "Primary" refers to the first signal, and "Secondary" refers to the second signal.

Figure 5A:
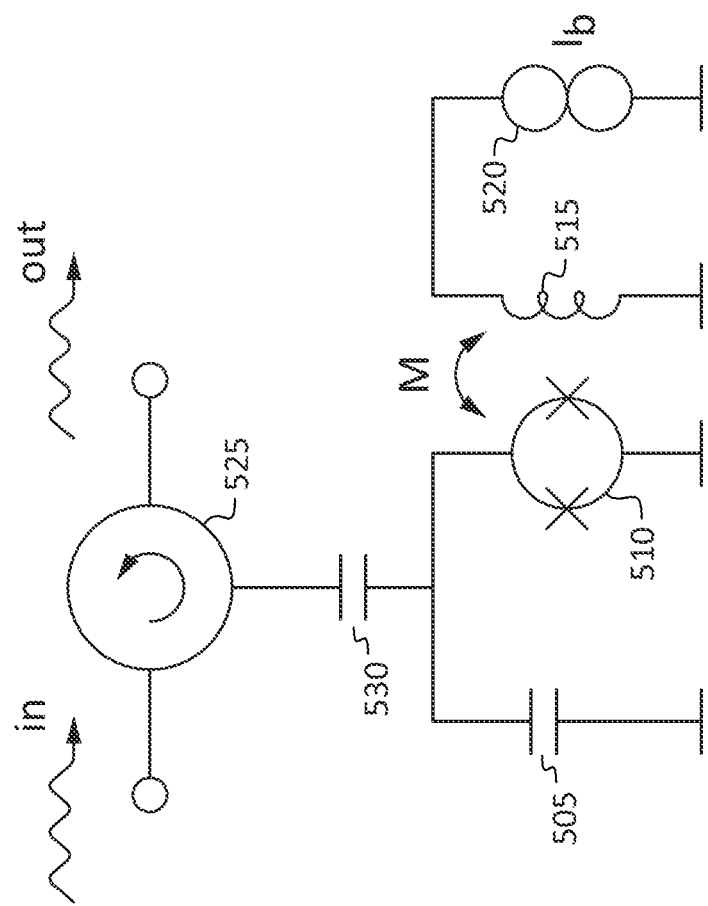
FIG. 5A is a schematic diagram of a portion of a reservoir computer, according to an embodiment of the present disclosure.
Figure 5B:
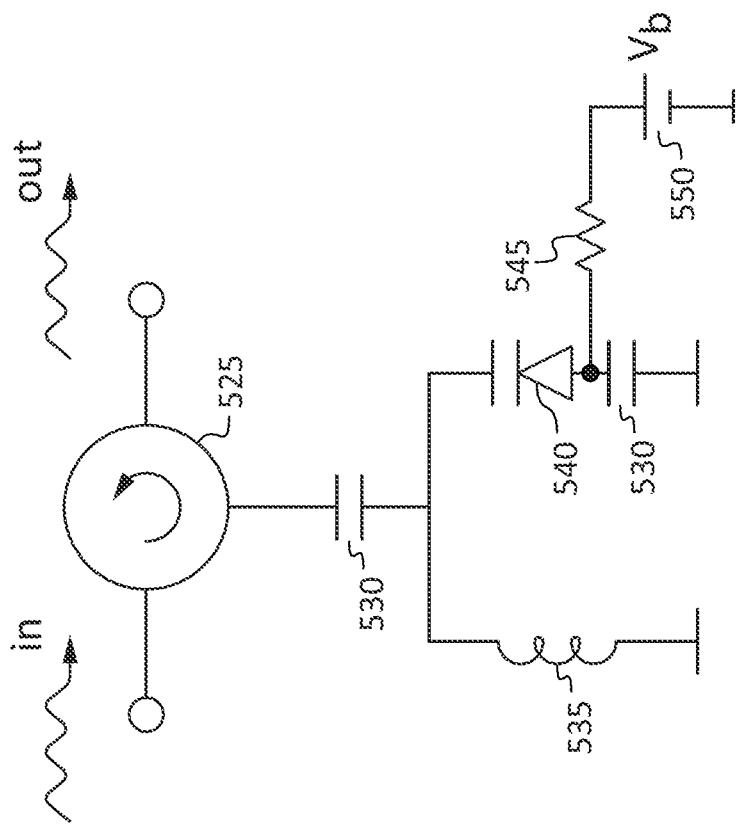
FIG. 5B is a schematic diagram of a portion of a reservoir computer, according to an embodiment of the present disclosure.

FIGS. 5A and 5B show examples of (i) a superconducting implementation of a Duffing oscillator, and of (ii) a Duffing oscillator suitable for operation at room temperature, respectively. In the superconducting implementation of FIG. 5A, the Duffing oscillator includes a first capacitor 505 and a superconducting quantum interference device (SQUID) 510 which operates as a nonlinear inductance and which provides the nonlinear Duffing term. The SQUID 510 can be tuned by applying magnetic flux bias from a biasing coil 515 (driven by a bias current source 520) to the SQUID loop. The input signal is coupled to the Duffing oscillator through a circulator 525, which is coupled to the Duffing oscillator by a DC blocking capacitor 530 and which also provides a connection for the output signal from the Duffing oscillator. Suitably cooled, the Duffing oscillator of FIG. 5A may operate as a quantum mechanical Duffing oscillator, e.g., it may operate in a state having an expected value of the energy less than 10 hf, where f is the small-amplitude resonant frequency of the oscillator and h is Planck's constant.

In the room temperature implementation of FIG. 5B, the Duffing oscillator includes an inductor 535 and a varactor 540 which operates as a nonlinear capacitance and provides the nonlinear Duffing term. The varactor may be tuned by applying a bias voltage (through a bias resistor 545, from a bias supply 550). In some embodiments a transistor operating as a varactor may be used instead of the varactor 540. In each of the embodiments of FIGS. 5A and 5B, the strength of the nonlinearity can be controlled by modulating the bias at twice the resonant frequency of the oscillator (or by applying a DC bias).

Although some embodiments described herein involve estimating the amplitude, phase, or frequency of a signal, the invention is not limited to such embodiments and may be employed in various other applications (e.g., in other signal processing applications).

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X−Y and the second quantity is at most X+Y. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

It will be understood that when an element is referred to as being "directly connected" or "directly coupled" to another element, there are no intervening elements present. As used herein, "generally connected" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively affect the behavior of the circuit.

Although limited embodiments of a Duffing oscillator reservoir computer have been specifically described and illustrated herein, many modifications and variations will be apparent to those skilled in the art. Accordingly, it is to be understood that a Duffing oscillator reservoir computer employed according to principles of this disclosure may be embodied other than as specifically described herein. Features of some embodiments are also defined in the following claims, and equivalents thereof.

What is claimed is:

1. A system, comprising:
   a Duffing oscillator, and
   a readout circuit,
   the readout circuit being configured to calculate a plurality of products, each of the products being calculated by multiplying a sample, of a plurality of samples of a signal from the Duffing oscillator, by a respective weight of a plurality of weights;
   the system further comprising an input circuit configured to receive an input signal, and to adjust the amplitude of the input signal, to an adjusted amplitude, to form an adjusted input signal,
   wherein a reflection coefficient of the Duffing oscillator is hysteretic as a function of frequency when measured with a signal having an amplitude equal to the adjusted amplitude.

2. The system of claim 1, wherein the readout circuit is further configured to calculate the sum of the products.

3. The system of claim 1, wherein the plurality of samples comprises ten samples.

4. The system of claim 1, wherein the Duffing oscillator comprises a resonant circuit comprising a varactor.

5. The system of claim 1, wherein the Duffing oscillator comprises a resonant circuit comprising a superconducting quantum interference device (SQUID).

6. The system of claim 1, wherein the system is configured to estimate the phase of each of two sinusoidal signals present in an input signal.

7. A system, comprising:
a Duffing oscillator, and
a readout circuit,
the readout circuit being configured to calculate a plurality of products, each of the products being calculated by multiplying a sample, of a plurality of samples of a signal from the Duffing oscillator, by a respective weight of a plurality of weights;
wherein the system is configured to estimate one of:
the phase of a sinusoidal input signal;
the frequency of a sinusoidal input signal; and
the amplitude of a sinusoidal input signal.

8. A method, comprising:
operating a reservoir computer,
wherein:
the reservoir computer comprises:
a Duffing oscillator; and
a readout circuit;
wherein the Duffing oscillator comprises a resonant circuit comprising a varactor or a resonant circuit comprising a superconducting quantum interference device (SQUID).

9. The method of claim 8, further comprising training the reservoir computer.

10. The method of claim 8, wherein the operating of the reservoir computer comprises calculating a plurality of products, each of the products being calculated by multiplying a sample, of a plurality of samples of a signal from the Duffing oscillator, by a respective weight of a plurality of weights.

11. The method of claim 10, wherein the operating of the reservoir computer further comprises calculating the sum of the products.

12. The method of claim 8, further comprising receiving an input signal, and adjusting the amplitude of the input signal, to an adjusted amplitude, to form an adjusted input signal.

13. The method of claim 12, wherein a reflection coefficient of the Duffing oscillator is hysteretic as a function of frequency when measured with a signal having an amplitude equal to the adjusted amplitude.

14. The method of claim 8, wherein the Duffing oscillator is in a state having an expected value of energy less than 10 hf wherein f is the small-amplitude resonant frequency of the Duffing oscillator and h is Planck's constant.

* * * * *